(12) United States Patent
Brask

(10) Patent No.: US 7,247,578 B2
(45) Date of Patent: Jul. 24, 2007

(54) METHOD OF VARYING ETCH SELECTIVITIES OF A FILM

(75) Inventor: Justin K. Brask, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 166 days.

(21) Appl. No.: 10/750,045

(22) Filed: Dec. 30, 2003

(65) Prior Publication Data

US 2005/0148131 A1    Jul. 7, 2005

(51) Int. Cl.
*H01L 21/302* (2006.01)
*H01L 21/461* (2006.01)

(52) U.S. Cl. .................... 438/753; 438/924

(58) Field of Classification Search ........... 438/753, 438/924
See application file for complete search history.

(56) References Cited

U.S. PATENT DOCUMENTS

| | | | |
|---|---|---|---|
| 3,738,880 A * | 6/1973 | Laker | 438/658 |
| 3,980,507 A * | 9/1976 | Carley | 438/548 |
| 4,379,001 A | 4/1983 | Sakai et al. | |
| 4,465,528 A | 8/1984 | Goto et al. | |
| 6,255,698 B1 | 7/2001 | Gardner et al. | |
| 6,309,975 B1 | 10/2001 | Wu et al. | |
| 6,346,485 B1 * | 2/2002 | Nihonmatsu et al. | 438/749 |

FOREIGN PATENT DOCUMENTS

| | | |
|---|---|---|
| DE | 19530 944 | 4/1996 |
| GB | 2 131 748 A | 6/1984 |
| GB | 2 358 737 A | 8/2001 |
| JP | 63 028067 A | 2/1988 |
| WO | WO 2004/061915 A | 7/2004 |
| WO | PCT/US2004/043393 | 12/2004 |
| WO | WO 2005/067026 A | 7/2005 |

* cited by examiner

*Primary Examiner*—Howard Weiss
(74) *Attorney, Agent, or Firm*—Blakely, Sokoloff, Taylor & Zafman LLP

(57) ABSTRACT

A method of patterning a crystalline film. A crystalline film having a degenerate lattice comprising first atoms in a first region and a second region is provided. Dopants are substituted for said first atoms in said first region to form a non-degenerate crystalline film in said first region. The first region and the second region are exposed to a wet etchant wherein the wet etchant etches the degenerate lattice in said second region without etching the non-degenerate lattice in the first region.

3 Claims, 8 Drawing Sheets

METHOD OF VARYING ETCH SELECTIVITIES OF A FILM

BACKGROUND OF THE INVENTION

1. Field of the Invention

The present invention relates to the patterning of crystalline films and more particularly to a method of altering the etch selectivity of crystalline films.

2. Discussion of Related Art

Semiconductor integrated circuits are fabricated from multiple layers of patterned thin films. Patterned single crystalline and polycrystalline thin films are used throughout manufacture of modern integrated circuits. For example, patterned semiconductor crystalline films, such as epitaxial silicon, gallium arsenide, and InSb are used to form semiconductor bodies or fins in nonplanar or tri-gate devices. Additionally, high dielectric constant metal oxide crystalline films are used to form gate dielectric layers in modern integrated circuits. Presently, crystalline films are patterned by first forming a mask with a desired pattern over a crystalline film. A wet etchant is then used to etch away the exposed portions of the crystalline film. Unfortunately, wet etchants undercut the mask resulting poor fidelity between the pattern in the mask and the resulting pattern in the crystalline film. Lack of fidelity between the patterning in the crystalline film and the mask limits the ability to further scale patterned dimensions of crystalline films. The ability to further scale the dimensions of crystalline films is essential in order to increase feature density in order to generate more powerful integrated circuits, such as microprocessors.

DETAILED DESCRIPTION OF THE PRESENT INVENTION

Figure 1A:
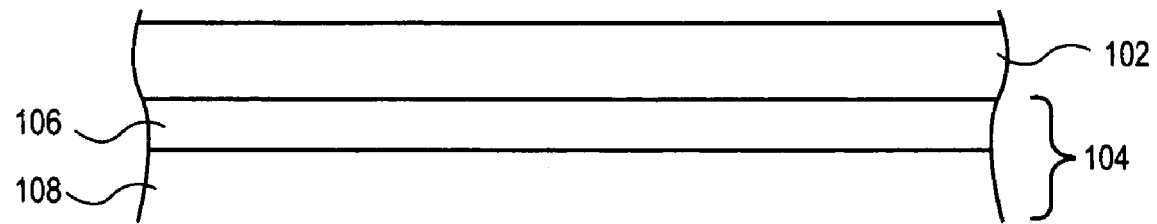
FIGS. 1A-1D illustrate a method of etching a crystalline film in accordance with the present invention.

A method of varying the etch selectivity of a crystalline film is described. In the following description numerous specific details are set forth in order to provide a thorough understanding of the present invention. In other instances, well known semiconductor processing techniques and features have not been described in particular detail in order to not unnecessarily obscure the present invention.

The present invention is a method to alter the etch selectivity of crystalline films by modifying the lattice energy of the film. According to the present invention, a crystalline film to be etched is provided. The crystalline film has symmetrical lattice or a "degenerate" lattice. Dopant atoms are then placed into a portion of the crystalline film and the film heated to a sufficient energy to cause the dopants to substitute with atoms in the crystalline film. Utilizing dopant atoms which have a sufficiently different size than the atoms of the crystalline film causes a distortion of the lattice and makes the lattice non-symmetric or "non-degenerate". Making a portion of the lattice non-degenerate causes a thermodynamic stabilization or lattice "energy dump" in the lattice and makes the non-degenerate portion stronger and more difficult to etch. The more stable non-degenerate lattice portion has a higher activation barrier for an etchant than does the unaltered degenerate portion of the film. The difference in the activation energy barriers between the degenerate lattice portion and the non-degenerate lattice portion of the crystalline film can be exploited by utilizing an etchant which has a sufficiently high activation energy to etch away the degenerate lattice portion of the crystalline film but not a high enough activation energy to etch away the non-degenerate lattice portion of the crystalline film. In this way, the degenerate lattice portion of the film can be etched away without etching the non-degenerate portion of the film resulting in a very high selectivity etch process. The present invention can be used to provide a selectivity of greater than 100:1. That is the present invention enables the degenerate portion of the film to etch over 100 times faster than the non-degenerate portion of the film with a particular etchant. Such an etch selectivity can be exploited to enable a maskless etching of films and enable an anisotropic etch of films utilizing a wet etchant. Such a process can be valuable in the patterning of crystalline films, such as semiconductor films used to form fins or bodies of a fin FET or nonplanar device and/or can be used to remove a crystalline sacrificial gate electrode during a replacement gate process (in both planar and non-planar devices). Other uses of the selective etching of a crystalline film, such as the selective etching of the high dielectric constant dielectric film used as a gate dielectric will become obvious from the description of the present invention.

An example of a method of patterning a film in accordance with an embodiment of the present invention is illustrated in FIGS. 1A-1D. According to the present invention, a film 102 to be etched is provided. The film 102 is a crystalline film having a symmetrical or degenerate lattice. The crystalline film can be a single crystalline film, such as an epitaxial film or a monocrystalline film. The crystalline film 102 can also be a polycrystalline film which comprises multiple grains of a single crystalline material. The crystalline film should be a non-mosaic film whereby individual unit cells or grains are sufficiently large that dopant atoms can be placed into and substituted with atoms of the lattice to distort the lattice and thereby make the lattice non-degenerate to provide a sufficiently different lattice energy and thereby have a sufficiently different activation barrier to an etchant than the degenerate lattice portion. In an embodiment of the present invention, the crystalline film 102 has a non-mosaic degenerate lattice. In an embodiment of the present invention, the crystalline film 102 is a single crystalline semiconductor film, such as but not limited to silicon, gallium arsenide, and InSb. In an embodiment of the present invention, the crystalline film 102 is a high dielectric constant metal oxide film, such as but not limited to hafnium oxide, zirconium oxide, titanium oxide and tantalum oxide.

The crystalline film 102 is formed on a substrate 104. In an embodiment of the present invention, the substrate 104 is an insulating substrate 104 in order to form a semiconductor on insulator (SOI) substrate. In an embodiment of the present invention, the insulating substrate includes an insulating film 106, such as silicon oxide or silicon nitride formed on a silicon monocrystalline substrate 108.

Figure 1B:
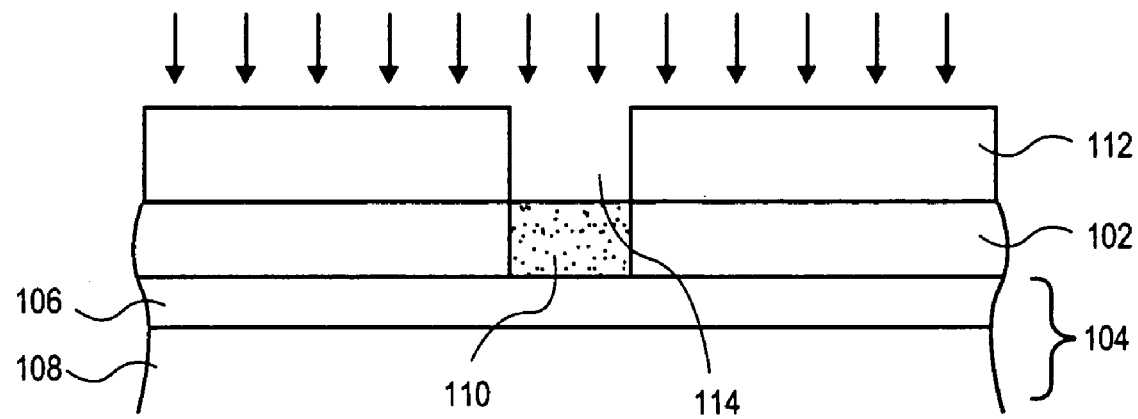

Next, as shown in FIG. 1B, dopant atoms are placed into the crystalline film 102 to form a doped region 110 in crystalline film 102. Doped region 110 can be formed by forming a mask 112 over crystalline film 102. Mask 112 has an opening 114 which defines the location or region 110 where dopants are to be placed in crystalline film 102. Mask 112 can be a photoresist mask which is formed by blanket depositing a photoresist film over crystalline film 102 and the using well known photolithography processes, such as masking, exposing, and developing to form opening 114 in the photoresist film. Although a photoresist mask 112 is ideally used, other types of mask can be used, such as but not limited to a hard mask formed from a silicon oxide, silicon nitride or silicon oxynitride film or combinations thereof. Dopants can then be placed into region 110 by, for example, ion implantation through opening 114. Mask 112 prevents the dopants from being placed into crystalline film 102 at locations covered by mask 112. In an embodiment of the present invention, dopants are placed utilizing a zero degree implant angle (i.e., an implant angle perpendicular to the plain of substrate 104). In this way, dopants are placed into region 110 in crystalline film 102 in alignment with opening 114. Although a zero degree or substantially zero degree ion implantation angle is desired in embodiments of the present invention, a larger angle ion implantation can be used if a doped region with an angle profile is desired. Although embodiments of the present invention utilize a mask 112 and ion implantation to form doped region 110, other well know techniques can be used to form doped region 114, such as but not limited to solid source diffusion.

The dopant atoms placed into crystalline film 102 have a sufficiently different size than the atoms which form the lattice of crystalline film 102. The dopants have a sufficiently different physical size (i.e., larger or smaller) than the atoms of the crystalline film such that when they substitute with atoms in the lattice of the crystalline film 102 they distort the symmetry of the lattice and make the lattice non-symmetrical or non-degenerate. In an embodiment of the present invention, the dopant atoms are smaller than the atoms in the crystalline lattice. In an alternative embodiment of the present invention, the atoms are physically larger than the atoms in the crystalline lattice. In an embodiment of the present invention, the dopants are electrically neutral with respect to the crystalline film such that when they are activated they do not alter the conductivity of the crystalline film. In an embodiment of the present invention, the dopants are not electrically neutral with respect to the crystalline film and make the crystalline film a conductive type (i.e., n type or p type) crystalline film. The dopant atoms are a sufficient size so that when they substitute with atoms in the lattice, they alter the lattice energy a sufficient amount to enable the selective etching of one over the other.

In an embodiment of the present invention, when the crystalline film is silicon, the dopant atoms can be boron or carbon. In an embodiment of the present invention, when the crystalline film is gallium arsenide, the dopant atoms can be boron or carbon. In an embodiment of the present invention, when the crystalline film is InSb the dopants can be boron or carbon or phosphorus. A sufficient number of dopants are placed into region 110 of crystalline film 102 to produce a concentration sufficient to make the degenerate crystalline film 102 into a non-degenerate crystalline film to a degree to enable the selective etching of the degenerate film without etching the non-degenerate film. A dopant concentration range between $1\times10^{15}$ to $1\times10^{22}$ atoms/cm3 has been found to provide a reasonable etch differential.

It is to be appreciated, at this time as shown in FIG. 1B, dopants have been placed into region 110 of the crystalline film 102 but reside at interstitial cites within the lattice. That is, at this time the dopants have not been "activated" whereby the dopant atoms substitute with atoms in the crystalline lattice.

Figure 1C:
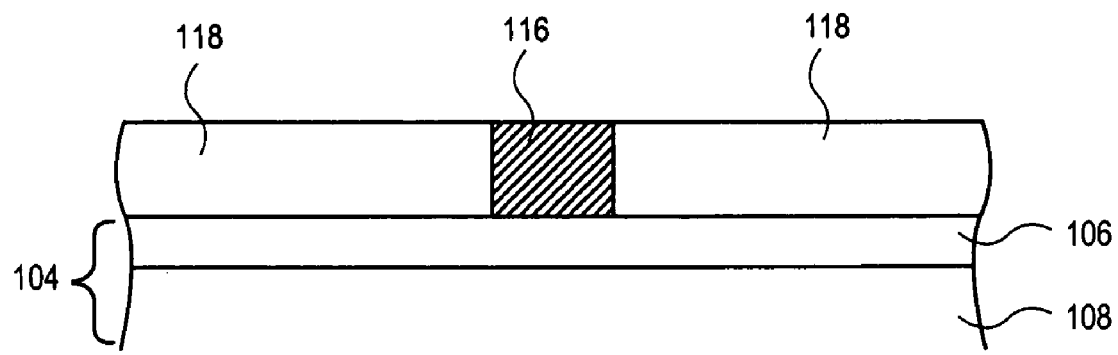

Next, as shown in FIG. 1C, the dopants in region 110 are activated so that the dopants move from interstitial cites within the crystalline lattice and substitute with atoms in the lattice. Since the dopant atoms are of a different physical size than the atoms which make up the lattice, the substitution of dopant atoms with atoms in the lattice causes the crystal film in region 110 to distort and become non-symmetrical and thereby forms a "non-degenerate" crystal lattice region 116. As the dopants substitute with atoms of the crystalline lattice, they make the crystal lattice in region 116 non-symmetrical and cause an "energy dump" relative to the degenerate crystal lattice 102. The "energy dump" produces a non-degenerate crystal lattice region 116 which has a lower lattice energy and more stable structure than the degenerate crystal lattice portion 118 of crystalline film 102. The activation of dopants essentially creates a crystalline film 102 having a non-degenerate region 116 and a degenerate region 118 as shown in FIG. 1C. Because non-degenerate lattice region 116 has a lower (thermodynamically more stable) lattice energy and is more stable than the degenerate lattice region 118 of crystalline film 102, a higher activation barrier must be over come to etch the non-degenerate lattice region 116 than the degenerate lattice region 118. The difference in the activation barriers for etching can be exploited to selectively etch the degenerate portion 118 without etching the non-degenerate portion 116.

Figure 1D:
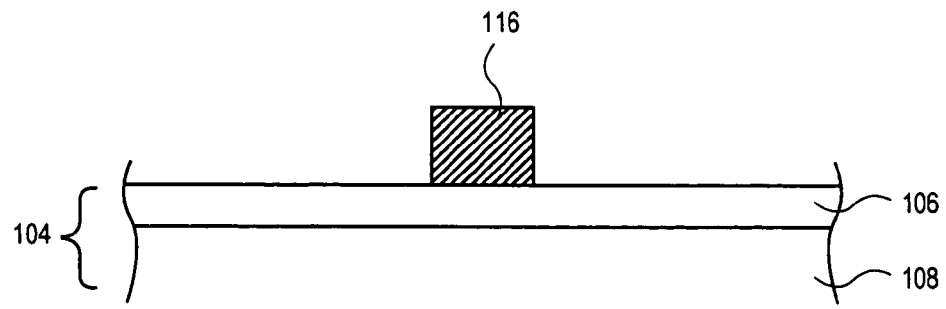

Next, as shown in FIG. 1D, the degenerate portion 118 of crystalline film 102 is etched away without etching the non-degenerate lattice portion 116. Because the degenerate lattice portion 118 is less stable than the non-degenerate lattice portion 116 and therefore has a lower activation energy barrier to overcome for an etchant which utilizes an associative reaction than the activation energy barrier for the non-degenerate portion 116. By utilizing an etchant which etches utilizing an associative reaction and which can overcome the activation energy barrier for the degenerate lattice portion 118 but not the non-degenerate lattice portion 116, the degenerate portion can be etched away without etching the non-degenerate portion. An etchant which etches utilizing an associative reaction is an etchant which utilizes a nuclecophilic (or in some cases, electrophillic) attachment whereby the atoms which make up the lattice (e.g., silicon) are directly attached to the etchant prior to removal of the atom from the lattice. In an embodiment of the present invention, the crystalline film is etched with an etchant which utilizes an associative reaction and which has a sufficient activation energy or chemical energy to over come the reaction threshold barrier for the degenerate portion 118 of the crystalline film 102 but not the non-degenerate portion 116. In this way, the degenerate lattice portion 118 of the crystalline film 102 can be etched away without etching the non-degenerate portion 116. By forming a degenerate lattice portion 118 and a non-degenerate lattice portion 116 in the crystalline film and utilizing a proper etchant, an etch selectivity of greater than 100:1 can be obtained.

When the crystalline film 102 is silicon, the degenerate lattice portion of crystalline film 102 can be etched way without etching away the non-degenerate lattice portion 116 by utilizing a wet etchant comprising a non-oxidizing basic solution. In an embodiment of the present invention, a silicon crystalline film 118 is etched utilizing a hydroxide etchant, such as but not limited to potassium hydroxide (KOH) and ammonium hydroxide. In an embodiment of the present invention, the silicon etchant has a pH between 9 and 11. In an embodiment of the present invention, the degenerate silicon crystalline film 18 is removed with a wet etchant comprising ammonium hydroxide and water comprising between 1-30% ammonium hydroxide by volume. In an embodiment of the present invention, the ammonium hydroxide and water etchant is employed at a temperature between 15-45° C. and megasonic or ultrasonic energy is applied to the solution during the etch process. In an embodiment of the present invention, the substrate is spun while removing the degenerate lattice portion 118.

When the crystalline film 102 is gallium arsenide or InSb, the degenerate portion 118 can be etched away without etching the non-degenerate lattice portion 116 by utilizing a wet etchant comprising an oxidant, such as nitric acid or hydrogen peroxide in the presence of an acid. In an embodiment of the present invention, the degenerate portion 118 of InSb or GaAs is etched with an etchant having a pH of less than 4 and ideally between 2 and 4.

After removal of degenerate lattice portion 118, only the non-degenerate portion 116 remains. It is to be appreciated that the crystalline film 102 has been etched to produce a patterned crystalline film 116 in direct alignment with opening 114 in mask 104. Additionally, crystalline film 102 has been anisotropically etched (etched in only one direction, the vertical direction) utilizing a wet etchant. Crystalline film 102 has been etched to produce a pattern crystalline film 116 with vertical sidewalls without requiring a plasma etchant or other dry etching techniques which expose the substrate to harmful plasmas. Still further, crystalline film 102 has been etched to produce the pattern crystalline film 116 without a mask present during the etching. As such, the film 102 has been etched in a maskless process. Additionally, the present invention has created feature 116 with a high degree of fidelity between opening 114 and without suffering from lateral undercutting of a mask normally associated with patterning of films using a mask and a wet etchant.

Figure 1E:
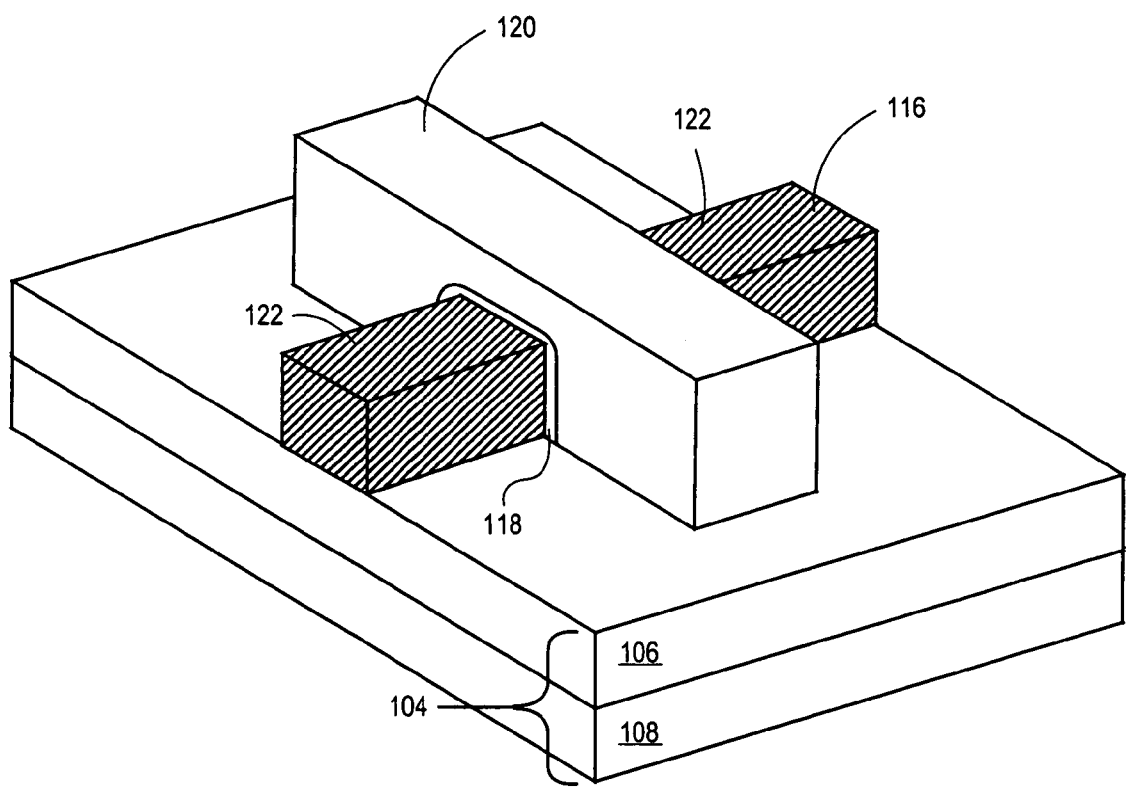
FIG. 1E illustrates the formation of a nonplanar device over a selectively etched film formed as illustrated in FIGS. 1A-1D.

In an embodiment of the present invention, patterned crystalline film 116 is a semiconductor film, such as but not limited to silicon, gallium arsenide, InSb, and is used to form the body or fin of a nonplanar or tri-gate transistor as shown in FIG. 1E. In order to form a nonplanar transistor a gate dielectric layer 118, such as silicon dioxide or silicon nitride is formed over the top and sidewalls of the patterned crystalline semiconductor film 116. A gate electrode 120 is formed on the gate dielectric layer 118 on the top surface and sidewalls of the patterned semiconductor body 116. Source/drain regions 122 are formed in the semiconductor body 116 on opposite sides of the gate electrode 120 as shown in FIG. 1E. A gate dielectric layer 118 and gate electrode 120 can be formed by blanket depositing a gate dielectric layer 118 over the substrate shown in FIG. 1D and then blanket depositing a gate electrode material over the gate dielectric film. The gate dielectric film and gate electrode film are then patterned with well known photolithography and etching techniques to form gate electrode 120 and gate dielectric layer 118. Next, well known ion implantation techniques can be used to implant either n type or p type conductivity ions into the semiconductor body 116 to form the source and drain regions 122.

Although the embodiment of the present invention described and illustrated with respect to FIGS. 1A-1D began with a crystalline film having a degenerate lattice and then a portion of the film made into a non-degenerate lattice and then the degenerate lattice portion etched away without etching away the non-degenerate lattice portion, the same concept may be used to selectively and masklessly pattern crystalline films in other embodiments. For example, in an embodiment of the present invention, a crystalline film having a non-degenerate lattice can be first provided. A crystalline film having a non-degenerate lattice can be formed as described above by substituting dopants of a larger or smaller size into a crystalline lattice having a symmetrical structure to distort the lattice and give it a lower, thermodynamically more stable, lattice energy. For example, the starting crystalline film can be a silicon crystalline film having boron atoms substituted with the silicon atoms in the lattice to provide a crystalline film having a non-degenerate lattice. Atoms or dopants of a similar size to the atoms of the lattice can then be substituted with the dopant atoms in the non-degenerate lattice to make a portion of the crystalline film degenerate or less non-degenerate. For example, silicon atoms can be implanted into a boron doped silicon crystalline film and substituted for the boron atoms to make the silicon film degenerate or less non-degenerate. The degenerate lattice or less non-degenerate lattice portion can then be removed with an appropriate etchant. In this way, the unaltered non-degenerate crystalline lattice portion would remain and the altered degenerate or less degenerate crystalline lattice portion removed.

In another embodiment of the present invention which utilizes an altering of the lattice structure or energy to change etch selectivity, a crystalline film having a degenerate lattice structure can be provided. A first region of the crystalline film can then be doped with dopant atoms which substitute with atoms of the degenerate crystalline film to provide a first region having a lattice structure with a first degree of non-degeneracy or a first lattice energy and then a second portion of the degenerate lattice doped with a different dopant or more or less of the same dopant to provide a second region with a lattice structure having a second degree of non-degeneracy lattice or a second lattice energy. Although both portions have been made into "non-degenerate" lattices, the difference in lattice energies or the degree of "non-degeneracy" can than be exploited to enable the selective etching of one without the etching of the other. As such, embodiments of the present invention alter the lattice structure or lattice energy of a first portion of a crystalline film relative to a second portion to such a degree that one can be etched without etching the other.

Figure 2A:
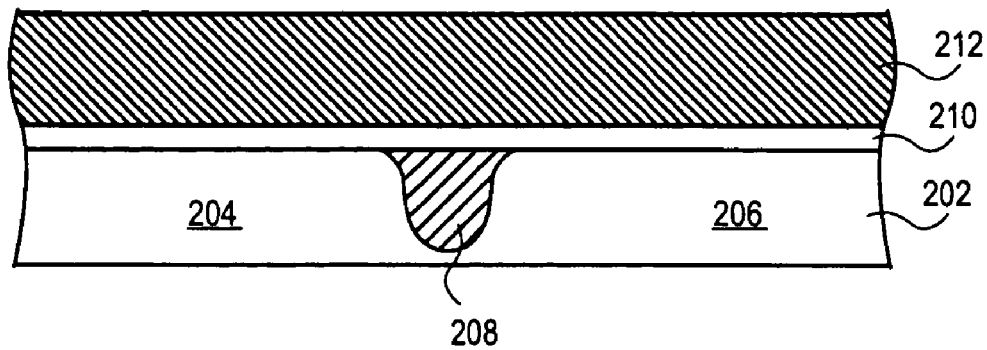
FIGS. 2A-2P illustrate a method of fabricating a CMOS integrated circuit comprising a n type transistor and a p type transistor utilizing a replacement gate technique which utilizes a selective etching of a crystalline film in accordance with the present invention.
Figure 2B:
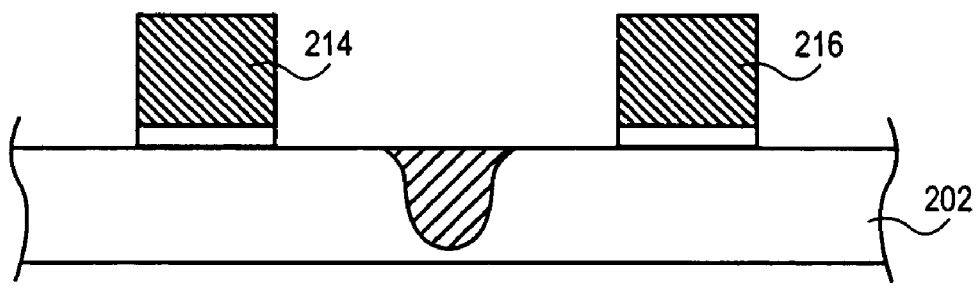
Figure 2C:
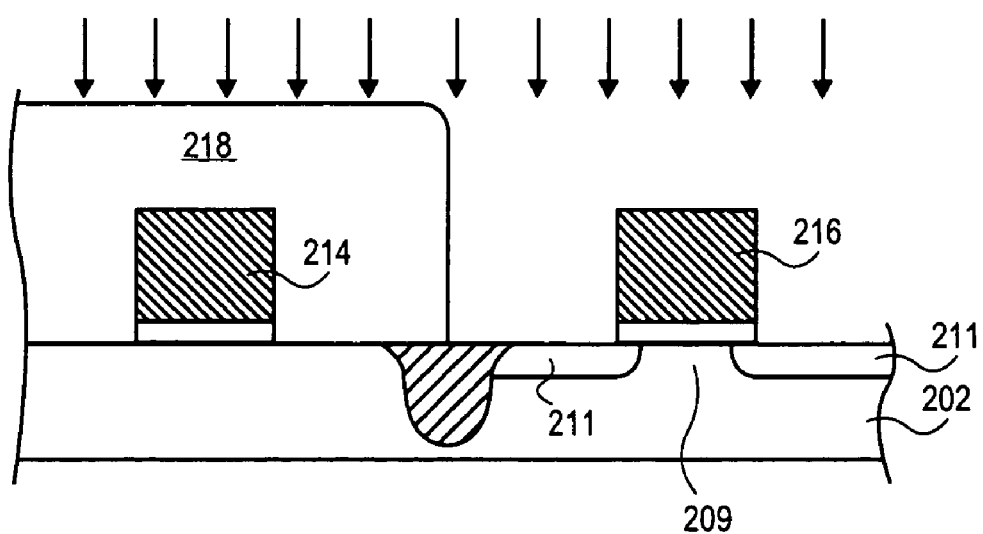
Figure 2D:
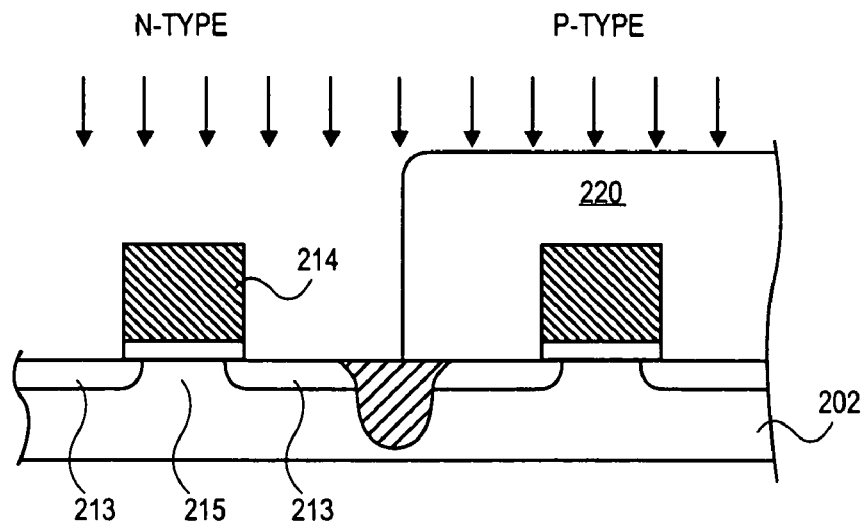
Figure 2E:
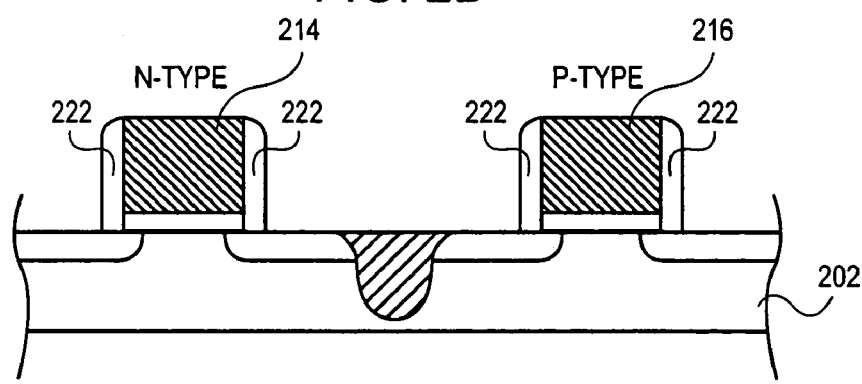
Figure 2F:
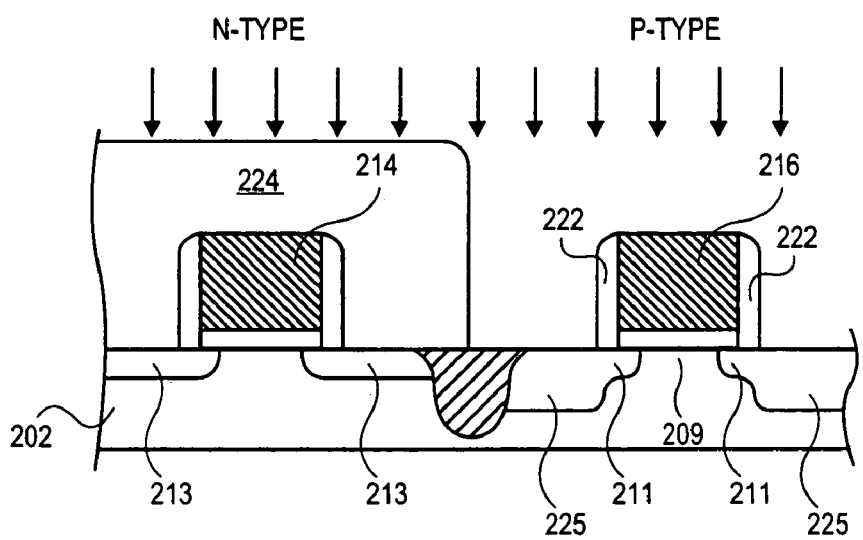
Figure 2G:
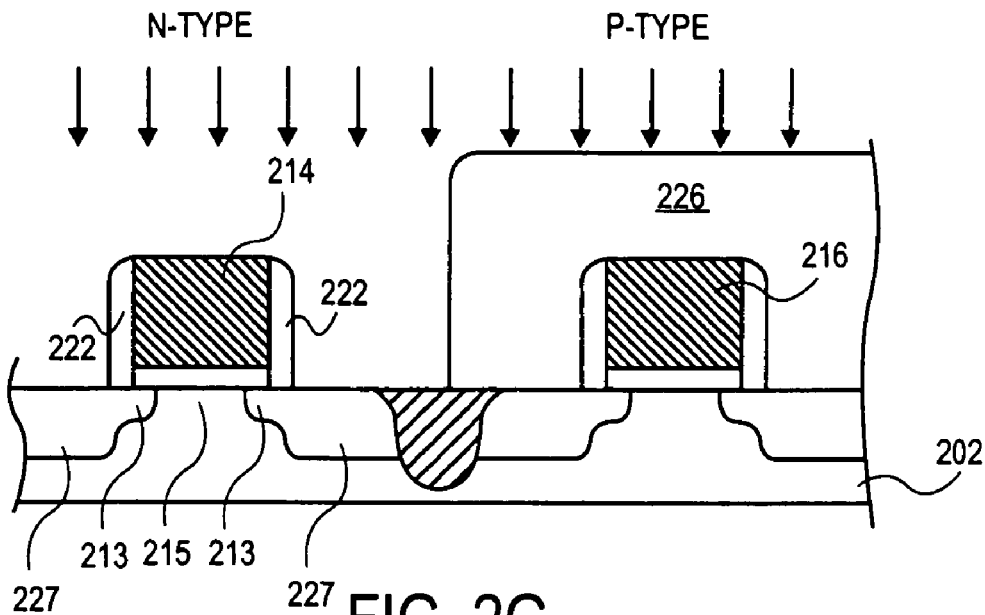
Figure 2H:
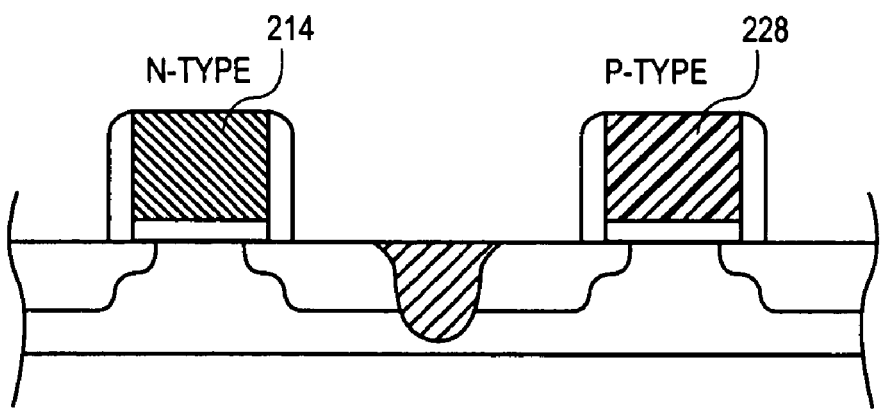
Figure 2I:
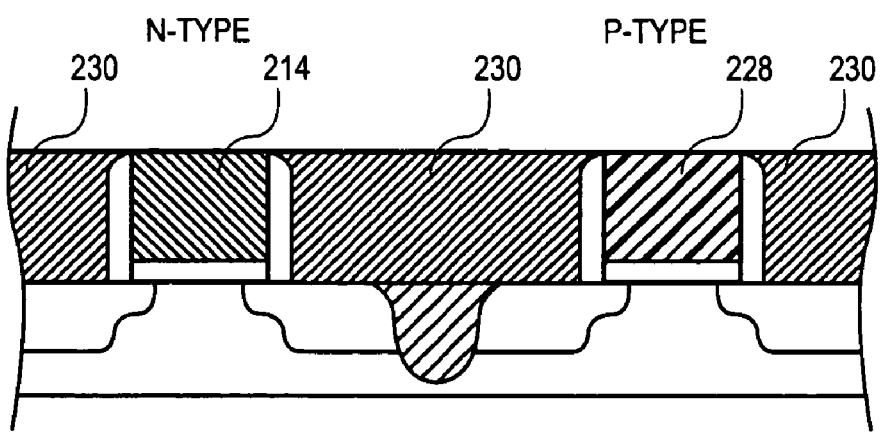
Figure 2J:
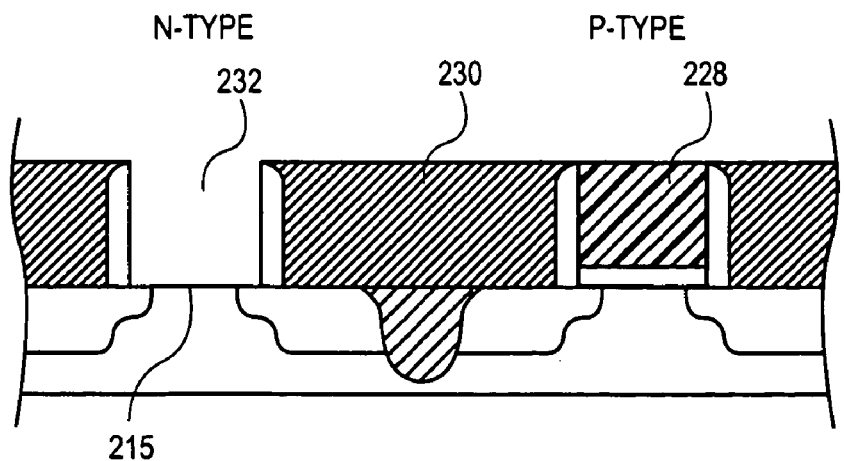
Figure 2K:
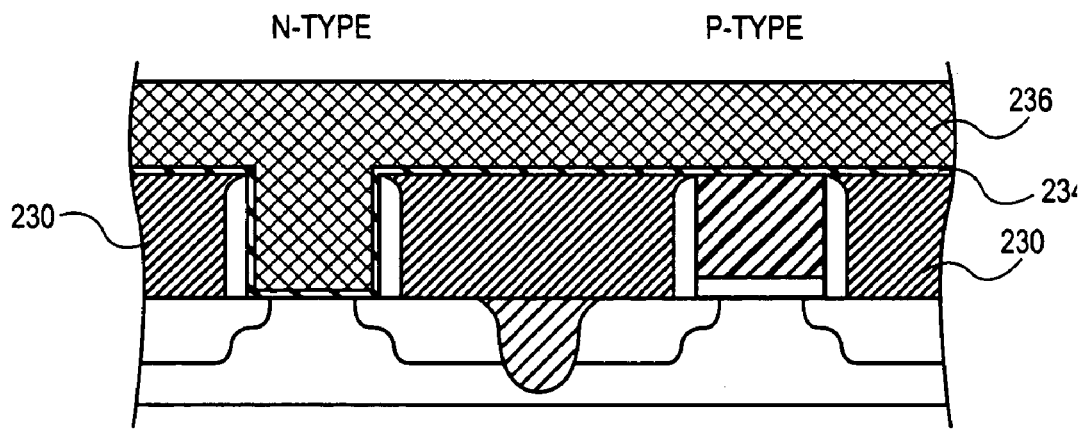
Figure 2L:
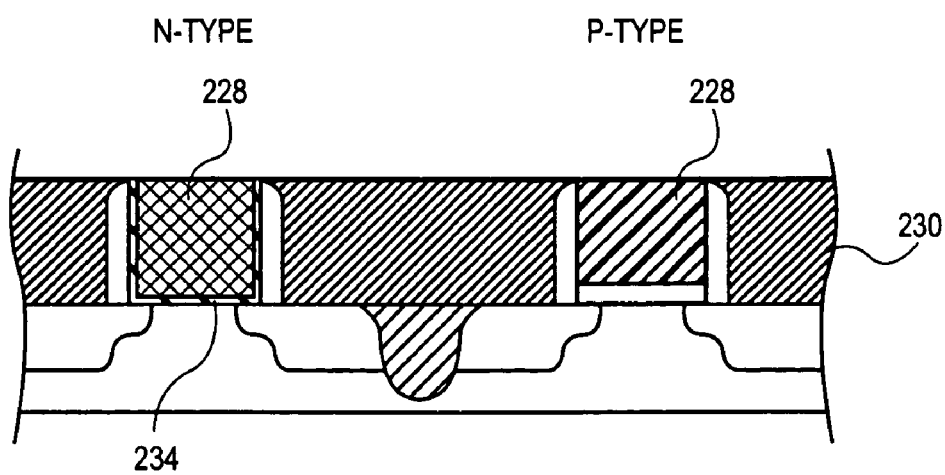
Figure 2M:
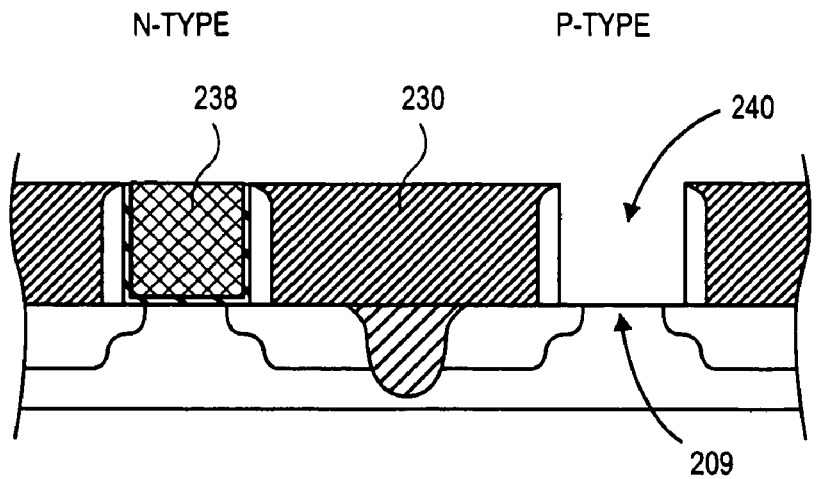
Figure 2N:
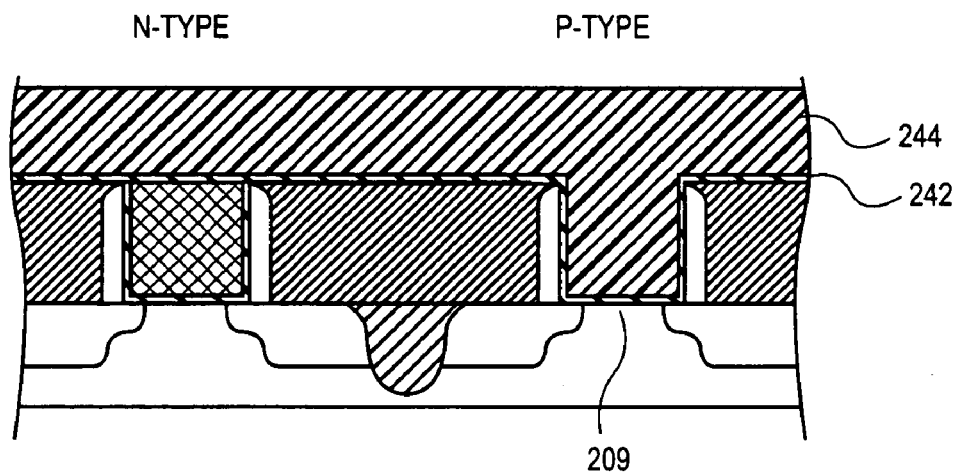
Figure 2O:
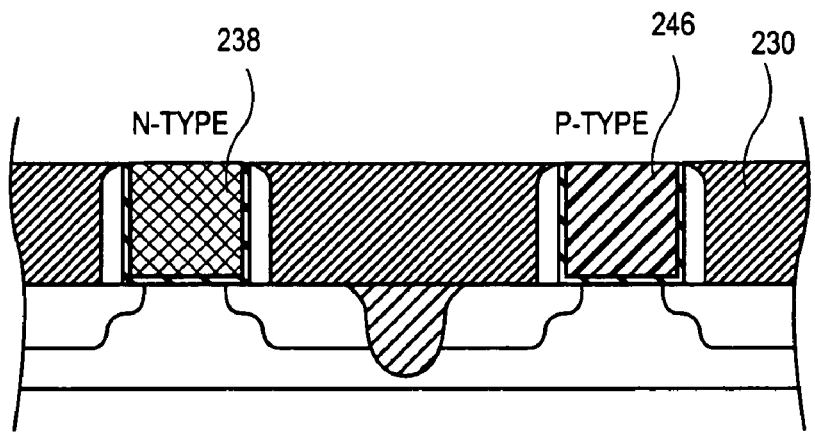
Figure 2P:
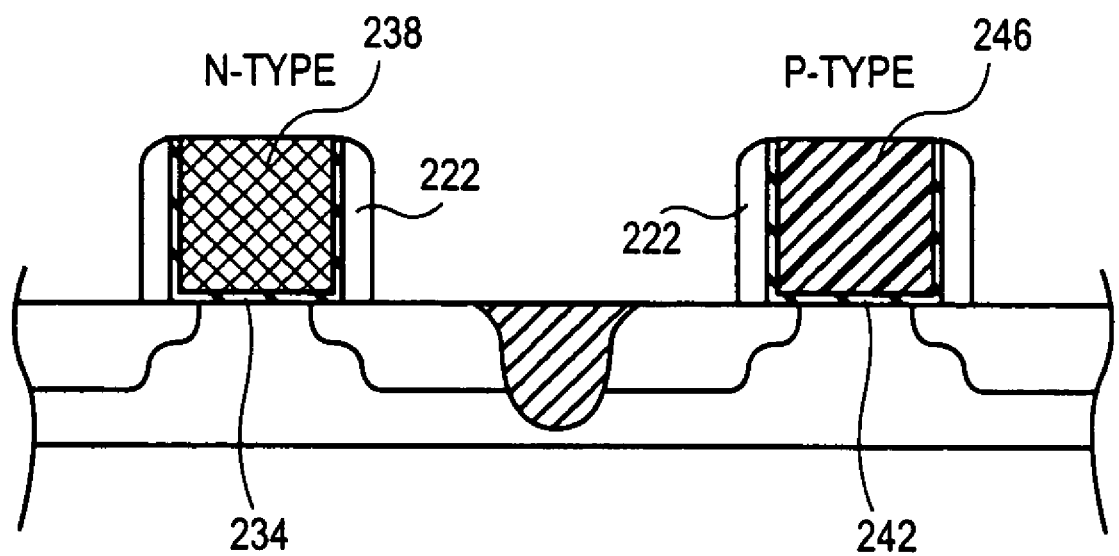

FIGS. 2A-2P illustrate a method of forming a p type device with a metal gate electrode and a n type nonplanar device with a metal gate electrode utilizing a replacement gate technique which exploits the selective etch process of the present invention. The replacement gate technique enables the gate electrodes for the p type device and the n type device to be formed of different materials. In this way, the gate electrode for the p type device can have a work function tailored for the p type device and the gate electrode for the n type device can have a work function tailored for the n type device. By tailoring the work functions of the gate electrodes for the particular device type, the performance of the CMOS integrated circuit can be dramatically improved. Although FIGS. 2A-2P illustrates a replacement gate method for forming a CMOS integrated circuit having conventional planar devices, the same technique can be used to form a CMOS integrated circuit having nonplanar or tri-gate devices such as shown in FIG. 1E.

In order to form a CMOS integrated circuit in accordance with embodiments of the present invention, first a semiconductor substrate, such as a silicon monocrystalline substrate, 202 is provided. Substrate 202 includes a region 204 doped to a p type conductivity for an n type device and a region 206 doped to a n type conductivity for a p type device. An isolation region 208, such as a trench isolation region (STI), is formed in substrate 202 to electrically isolate regions 204 and 206. Next, a sacrificial gate dielectric layer 212 is formed over substrate 202 as shown in FIG. 2A. The sacrificial gate dielectric 602 is ideally formed from a material which will not sufficiently etch during the removal or etching of the sacrificial gate electrode material so that it can protect the underlying semiconductor body when the sacrificial gate electrode is subsequently removed. This is especially important when the sacrificial gate electrode material and semiconductor substrate 202 are formed from the same material, such as silicon. In an embodiment of the present invention, the sacrificial gate dielectric is an oxide, such as silicon dioxide formed to a thickness between 10-30 Å. If the sacrificial gate dielectric is a grown dielectric it will form only on the exposed surfaces of the semiconductor substrate 202 and not on the isolation region 208. If the sacrificial gate dielectric is a deposited film it will be blanket deposited onto the isolation region 208 as well as the semiconductor substrate 202 as shown in FIG. 2A.

Next, a sacrificial gate electrode material 212 is blanket deposited over the sacrificial gate dielectric, the sacrificial gate electrode material 213 is deposited to a thickness desired for the height of the subsequently formed gate electrodes for the nonplanar devices. The sacrificial gate electrode material and the sacrificial gate dielectric are then patterned by well known techniques, such as photolithography and etching to form the sacrificial gate electrode 214 for the n type device and the sacrificial gate electrode 216 for the p type device as shown in FIG. 2B. The sacrificial gate electrode 214 and 216 are patterned into the same shape and at the same location where the subsequently formed gate electrodes for the p type device and the n type device are desired.

The sacrificial gate electrode material is a material which can be altered into an altered sacrificial material so that either the sacrificial material or the altered sacrificial material can be selectively etched or removed without etching or removing the other. That is, the sacrificial gate electrode material is formed of a material which can be altered so that either: 1) the altered sacrificial material can be etched or removed without etching the unaltered sacrificial material or 2) the unaltered sacrificial material can be removed of etched away without etching or removing the altered sacrificial material. As will be discussed below, this differentiating of the p type sacrificial gate electrode and n type sacrificial gate electrode will enable the different sacrificial gate electrodes to be removed at separate times enabling the openings to be subsequent filled with different materials.

In an embodiment of the present invention, the sacrificial material is a material having a crystalline structure, such as a polycrystalline film or single crystalline film which can be altered by increasing the activation energy necessary to etch the film. In an embodiment of the present invention, the crystalline film has symmetrical or degenerate lattice which can be altered by placing dopants therein to create a non-symmetrical lattice or a "non-degenerate" lattice. In an embodiment of the present invention, the sacrificial film is crystalline film which can be altered by changing the crystal lattice so that altered crystal lattice has a sufficiently higher activation energy barrier to etching than the unaltered crystal lattice. In an embodiment of the present invention, the sacrificial material is crystalline film which is altered by substituting dopant atoms with atoms in the crystal lattice in the film to thereby form an altered crystal lattice which has a higher activation energy than the unaltered crystal lattice. In other words, dopants are placed in the crystal lattice to alter the sacrificial film and give it a higher activation barrier than does the unaltered sacrificial film. In this way, an etchant which has an sufficiently high activation energy to etch away the unaltered film but not a high enough activation energy to etch the altered film, will only etch the unaltered film and will not etch the altered film. As such, an embodiment of the present invention utilizes a sacrificial material which can be altered to create a sufficiently different lattice energy so that the difference can be exploited to selectively remove of one without the other. In an embodiment of the present invention, the difference between the activation energy of the sacrificial gate electrode over the n type region and the altered sacrificial gate electrode over the p type region is sufficient to enable the etching of one without the etching of the other. Additionally, in an embodiment of the present invention, the sacrificial gate electrode material for the p type device and the sacrificial gate electrode material for the n type device are both altered, but are altered in such a manner that a difference between the altered films is sufficient to enable a selective etching one over the other. In an embodiment of the present invention, the sacrificial film is a polycrystalline silicon film. In other embodiments of the present invention, the sacrificial film is monocrystalline silicon film or an epitaxial silicon film. In an embodiment of the present invention, the polycrystalline silicon sacrificial gate electrode material is altered by substituting boron atoms for silicon atoms in the crystal lattice.

Next, if desired, tip or source/drain extensions can be formed by doping the semiconductor substrate 102 on opposite sides of the sacrificial gate electrodes 214 and 216 with impurities of the same conductivity type to be used to form the source and drain regions. In an embodiment of the present invention, the tip regions are formed utilizing well known ion implantation techniques. First, as shown in FIG. 2C a photoresist mask 218 can be formed over the regions for the n type device and the region for the p type device left unmasked. P type impurities can then be ion implanted into the semiconductor substrate 202 in alignment with the outside edges of the sacrificial gate electrode 216 for the p type device. The sacrificial gate electrode 216 prevents the channel region 209 of the semiconductor substrate 202 from being doped with p type dopants during the tip formation step. The sacrificial gate electrode becomes doped with p type dopants this at this time. The implantation process places p type dopants, such as boron, into the sacrificial gate electrode 216. However, because the dopants have not yet been activated at this time by a high temperature process, the dopants atoms reside at interstitial sites of the lattice, and are not yet substituted with atoms in the lattice. In an embodiment of the present invention, when semiconductor substrate 202 and sacrificial gate electrode 216 are silicon, they can be doped with boron ions at doses and with energies well known in the art to subsequently form tip regions 211 with a boron concentration between $1 \times 10^{19}$ to $1 \times 10^{21}$ atoms/cm$^3$. Photoresist mask 218 prevents the n type device region from being doped with p type conductivity ions.

Next, as shown in FIG. 2D, the photoresist mask 218 is removed and a photoresist mask 220 formed over the p type device and the n type device left unmasked. Next, n type impurity ions are implanted into the semiconductor substrate 202 on opposite sides of the sacrificial gate electrode to form tip regions 213. Sacrificial gate electrode 214 prevents the channel region 215 of a semiconductor substrate 202 from being doped during the tip formation step. The sacrificial gate electrode 214 also becomes doped at this time with n type dopants. Because the dopants have not yet been activated by a high temperature process the dopants reside at interstitial cites in the lattices of the sacrificial gate electrode 214 and the semiconductor substrate 202, and have not yet substituted with atoms in the lattice. In an embodiment of the present invention, when semiconductor substrate 202 and sacrificial gate electrode 214 are silicon, arsenic or phosphorous atoms can be implanted at a dose and with an energy well known in the art to create tip regions with an n type concentration of between $1\times10^{19}$ to $1\times10^{21}$ atoms/cm$^3$. The photoresist mask 220 is then removed.

Next, if desired, dielectric sidewall spacers 216 can be formed along opposite sidewalls of the sacrificial gate electrodes 214 and 216 as shown in FIG. 2E. The sidewall spacers can be formed by any well known techniques, such as by blanket depositing the conformal sidewall spacer dielectric over the substrate including the top surface and sidewalls of the sacrificial gate electrodes 214 and 216 as well as onto the exposed surface of substrate 202. The dielectric spacer material is deposited to a thickness which is approximately equal to the width desired for spacers 222. In an embodiment of the present invention, the dielectric spacer material is deposited to a thickness between 20-350 Å. The spacer material can be a dielectric, such as silicon nitride, silicon oxide, silicon oxynitride or combinations thereof. In an embodiment of the present invention, the spacer material is silicon nitride formed by a hot wall low pressure chemical vapor deposition (LPCVD) process. The dielectric spacer material is then anisotropically etched back to remove the dielectric spacer material from a horizontal surface (e.g., top surface) of the sacrificial gate electrodes 214 and 216 and the top surface of semiconductor substrate 202 and insulating substrate 202, while leaving spacer material on the vertical surfaces (e.g., sidewalls) of sacrificial gate electrodes 214 and 216 to form sidewall spacers 212 as shown in FIG. 2E.

At this time, if desired, additional silicon can be formed onto substrate 202 to form raised source/drain regions. The additional silicon, such as epitaxial silicon, can be formed on the exposed surface of the semiconductor substrate 202 utilizing a well known selective deposition process. A selective silicon deposition process will deposit silicon, such as epitaxial silicon onto silicon containing regions, such as substrate 202 and will not deposit silicon onto non-silicon containing areas, such as sidewall spacers 212.

Next, heavy source/drain contact regions may be formed in the semiconductor substrate 202 on opposite sides of the sacrificial gate electrodes 214 and 216. In an embodiment of the present invention, the heavy source/drain regions are formed by ion implantation. In such a process, a photoresist mask 224 can be formed over the n type transistor region and the p type transistor region left unmasked. P type dopants are then ion implanted into the semiconductor substrate 202 in alignment with the outside edges sidewall spacer 222 formed on to form source/drain contact regions 225. Additionally, the ion implantation process implants p type dopants, into the sacrificial gate electrode 216. When the semiconductor substrate 202 is silicon and the sacrificial gate electrode 216 is polycrystalline silicon, boron ions can be implanted at a dose and at an energy well known in the art to subsequently form a boron concentration between $1\times10^{19}$ to $1\times10^{21}$ atoms/cm$^3$ in the polycrystalline silicon sacrificial gate electrode 216 and silicon substrate 202. Because the dopants have not yet been activated at this time by a high temperature process, the dopants reside at interstitial sites in the lattice, and have not yet substituted with atoms in the lattice. The sacrificial gate electrode 216 masks the channel region 209 of the p type device from being doped with p type impurities during the heavy source/drain contact implant. Additionally, the sidewall spacers 222 prevent the underlying previously formed tip regions 211 in the semiconductor substrate 202 from being doped by the heavy source/drain implant.

Next, the photoresist mask 224 is removed. A photoresist mask 226 is then formed over the p type transistor region and the n type transistor region left unmasked as shown in FIG. 2G. Next, n type conductivity ions are ion implanted into the semiconductor substrate 202 on opposite sides of sidewall spacers on sacrificial gate electrode 214 in order to form heavily doped source and drain contact regions. The sacrificial gate electrode 214 masks the channel region 215 of the n type device from being doped during the heavy source/drain formation step. Additionally, the sidewall spacers 222 prevent the underlying previously formed tip regions 213 in the semiconductor substrate 202 from being doped by the heavy source/drain implants. The heavy source/drain implant also dopes sacrificial gate electrode 214 with n type impurities. Because the dopants have not yet been activated by a high temperature process the dopants reside at interstitial sites in the lattices of the sacrificial gate electrode 214 and the semiconductor substrate 202, and have not yet substituted with atoms in the lattice. In an embodiment of the present invention, when the semiconductor substrate 202 and the sacrificial gate electrode are silicon, phosphorous atoms can be implanted at a dose and an energy well known in the art to subsequently form phosphorous concentration between $1\times10^{19}$ to $1\times10^{21}$ atoms/cm$^3$.

Next, as shown in FIG. 2H, the substrate is annealed to activate the dopants placed in the semiconductor substrate 202. Additionally, the activation anneal also activates the dopants placed into the sacrificial gate electrodes 214 and 216. That is, the substrate is now annealed to a temperature and for a time sufficient to cause the n type dopants and the p type dopants in semiconductor substrate 202 to move from interstitial sites an substitute with atoms in the lattice to form n type source and drain regions and p type source and drain regions. In an embodiment of the present invention, the anneal causes a formation of tip regions and heavy source/drain contact regions with a concentration in the range of $1\times10^{19}$ atoms/cm$^3$ to $1\times10^{21}$ atoms/cm$^3$. The anneal also causes the n type dopants placed into the sacrificial gate electrode 214 to move from interstitial sites and substitute with atoms in the lattice of the sacrificial gate electrode 214. Additionally, the anneal also causes the p type dopants to move from interstitial sites in the sacrificial gate electrode 216 and substitute with atoms in the lattice of the sacrificial gate electrode 216.

In an embodiment of the present invention, when the sacrificial gate electrodes are polycrystalline silicon, boron atoms substitute with silicon atoms in the lattice of sacrificial gate electrode 216 and phosphorous atoms substitute with silicon atoms in the lattice of sacrificial gate electrode 214. Because boron atoms are smaller than silicon atoms, boron atoms form closer and tighter bonds with silicon atoms in the lattice than do silicon atoms. The result is that the silicon lattice is no longer symmetrical throughout resulting in "an energy dump" of the lattice. When the silicon lattice in the polycrystalline sacrificial gate electrode 216 becomes less symmetrical or distorted the crystal lattice can be said to be "non-degenerate". The making of the crystal lattice in sacrificial gate electrode 216 "non-degenerate" and resulting energy dump makes the boron doped polycrystalline sacrificial silicon film more stable and requires a higher activation energy in order to etch than an undoped polysilicon film or a polysilicon film that has a symmetric lattice or a "degenerate" lattice. As such, as shown in FIG. 2H, the thermal activation of the boron dopants in the sacrificial polysilicon gate electrode 216 converts the sacrificial gate electrode 216 into an altered sacrificial gate electrode 228 which has a different etching characteristics than the unaltered sacrificial gate electrode. It is to be noted that the activation of the phosphorous atoms in the polycrystalline sacrificial gate electrode 214 also causes the silicon lattices to become distorted or "non-degenerate" but to a much lesser extent than the boron atoms in the sacrificial polysilicon gate electrode 216 (this is because phosphorous atoms have a physical size that is close to the size of silicon atoms). Since the phosphorous dopants cause only a slight distortion of the silicon lattice of the polysilicon sacrificial gate electrode 214 (i.e. only slightly make the lattices "non-degenerate"), the sacrificial gate electrode 214 can be considered unaltered. The result of the implantation and activation is the formation of an altered sacrificial gate electrode 228 and an unaltered sacrificial gate electrode 214 which have different lattice energies and energy barriers which can be exploited to enable the selective etching of the unaltered sacrificial gate electrode without etching of the altered sacrificial gate electrode.

Next, as shown in FIG. 2J, a dielectric layer 230 is blanket deposited over the substrate. The dielectric layer is formed to a thickness sufficient to completely cover the substrate including sacrificial gate electrodes 214 and altered sacrificial gate electrode 228. A dielectric layer 230 is formed of a material which can be selectively etched with respect to the altered and unaltered sacrificial gate materials 228 and 214. That is, a dielectric material is formed of a material whereby the sacrificial gate electrode 214 and the altered sacrificial gate electrode 228 can be removed without significantly etching away the dielectric layer 230. After blanket depositing the dielectric layer 230, the dielectric layer is planarized, such as by chemical mechanical planarization, until the top surface of the dielectric film is planar with the sacrificial gate electrode 214 and altered sacrificial gate electrode 228, and the top surface of the sacrificial gate electrode 214 and the altered sacrificial gate electrode 228 exposed as shown in FIG. 2H.

Next, as shown in FIG. 2J, the sacrificial gate electrode 214 is now removed without removing altered sacrificial gate electrode 228. After sacrificial gate electrode 214 is removed, the sacrificial gate dielectric layer 210 is also removed. Removal of the sacrificial gate electrode 214 forms an opening 232 where the gate electrode for the n type device will be formed. Removing the sacrificial gate electrode 214 and the sacrificial dielectric layer 210 exposes the channel region 215 of the semiconductor substrate 214 of the n type device as shown in FIG. 2J.

The sacrificial gate electrode 214 is removed with an etchant which can etch away sacrificial gate electrode material 214 without significantly etching away the altered sacrificial gate electrode materials 228. In an embodiment of the present invention, the sacrificial gate electrode 214 is removed with a wet etchant. In an embodiment of the present invention, the wet etchant has a sacrificial gate electrode material to altered sacrificial gate electrode material selectivity of great than 100:1 (i.e., the wet etchant etches the sacrificial gate electrode material at least 100 times faster than the altered sacrificial gate electrode material). In an embodiment of the present invention, the n type polycrystalline silicon sacrificial gate electrode material 214 is removed with an wet etchant. In an embodiment of the present invention, megasonic energy is applied while the sacrificial gate electrode 214 is removed with the wet etchant. In an embodiment of the present invention, an n type polysilicon sacrificial gate electrode material 214 is removed with a wet etchant comprising a metallic hydroxide, such as but not limited to potassium hydroxide (KOH) or ammonium hydroxide (NH$_4$OH). In an embodiment of the present invention, the sacrificial polycrystalline sacrificial silicon gate electrode 214 is removed with a wet etchant comprising ammonium hydroxide and water comprising between 1-30% ammonium hydroxide by volume. In an embodiment of the present invention, the ammonium hydroxide and water etchant is heated to a temperature of between 15-45° C. and megasonic or ultrasonic energy is applied to the solution during the etch process. In an embodiment of the present invention, the substrate is spun while removing sacrificial gate electrode 214. In an embodiment of the present invention, the sacrificial gate electrode 214 is removed with an etchant which does not have a sufficient energy to overcome the activation energy barrier for the crystal lattice of the altered sacrificial gate electrode 228. In this way, the altered sacrificial gate electrode 228 remains unetched during the etching of the sacrificial gate electrode 214. The present invention enables the removal of the sacrificial gate electrode 214 for the n type device without removing the sacrificial gate electrode for the p type device and does so without requiring a mask or other photolithographic processing steps. As such, the sacrificial gate electrode 214 is removed with a maskless approach thereby saving expensive lithographic process steps and making the present invention manufacturable. Once the sacrificial gate electrode material 214 has been removed, the etchant stops on the sacrificial dielectric layer 210. In an embodiment of the present invention, the sacrificial dielectric layer 210 is an oxide and has a selectivity to the sacrificial gate electrode of at least 10:1. Next, the sacrificial gate dielectric layer 210 is removed with an etchant, such as but not limited to aqueous hydrofluoric acid.

Next, the gate dielectric layer and the gate electrode material for the n type device are formed in the openings 232 as shown in FIG. 2K. First the gate dielectric film 234 is blanket deposited over the substrate. The gate dielectric material covers the of the channel region 215 of semiconductor substrate 202. The gate dielectric material can be formed by any well known process. In, an embodiment of the present invention, a thermal oxidation process, such as a dry/wet oxidation is used to grow a gate dielectric layer 234, such as a silicon dioxide or silicon oxynitride dielectric. In another embodiment of the present invention a conformal deposition process, such as CVD or ALD is used to deposit a high K gate dielectric layer. Next, a gate electrode material 236 for the n type device is blanket deposited over the gate dielectric 234. The gate electrode material 236 may be any well known gate electrode material. In an embodiment of the present invention, the gate electrode material has a work function tailored for an n type device. In an embodiment of the present invention, the gate electrode has a work function between 3.9 eV to 4.2 eV. In an embodiment of the present invention, when the semiconductor substrate 202 is p type silicon, the gate electrode material is selected from the group consisting of hafnium, zirconium, titanium, tantalum, and aluminum with a work function between about 3.9 eV and about 4.2 eV. Next, the gate electrode material 236 is planarized until the top surface of the dielectric layer 230 is revealed as shown in FIG. 2L. Once a gate electrode material and the gate dielectric material are polished back or removed from the top dielectric film 230, a gate electrode 238 is formed for the n type device.

Next, as shown in FIG. 2M, altered sacrificial gate electrode 228 is now removed without removing gate electrode 238 for the n type device. After the altered sacrificial gate electrode 228 is removed the sacrificial gate oxide 602 is removed. Removal of altered sacrificial gate electrode 228 and the sacrificial gate dielectric layer 210 exposes the channel region 209 of the semiconductor substrate 202 of the nonplanar p type device as shown in FIG. 2M. Additionally, removal of the altered sacrificial gate electrode 228 forms an opening 240 in dielectric layer 220 where the gate electrode for the p type device will subsequently be formed. In an embodiment of the present invention, the boron doped polysilicon sacrificial gate electrode 228 is removed utilizing a wet etchant comprising tetramethylammonium hydroxide and water. In an embodiment of the present invention, tetramethylammonium hydroxide comprises between 10-35% of the solution by volume. In an embodiment of the present invention, the tetramethylammonium hydroxide solution is heated to a temperature between 60-95° C. during the etching. In an embodiment of the present invention, sonic energy such as, ultrasonic or megasonic energy, is applied during the etch process. Sonic energy provides agitation to the etchant which enables etch residue from altered sacrificial gate electrode 228 to be removed from opening 240 and allows new etchant to enter into trench 240 to etch the altered sacrificial gate 228.

In an embodiment of the present invention, the sacrificial gate electrode etchant is selective to the sacrificial gate dielectric layer (i.e., does not etch or only slightly etches sacrificial gate dielectric) so that the sacrificial gate dielectric 210 acts as an etch stop for the altered sacrificial gate electrode etch. In this way, the underlying semiconductor substrate 202 is protected from the etchant. A sacrificial gate electrode 228 to sacrificial gate dielectric etch selecting of at least 10:1, is desired.

Next, the sacrificial gate dielectric 210 is removed. In an embodiment of the present invention, the sacrificial gate dielectric 210 is an oxide and can be removed with an etchant comprising aqueous hydrofluoric acid.

Next, as shown in FIG. 2N, a gate dielectric film 242 for the p type device is blanket deposited over the substrate. The gate dielectric film 242 covers the top surface and sidewalls of the channel region 209 of semiconductor substrate 202. The gate dielectric layer 642 can be formed by any well known process. In an embodiment of the present invention, the gate dielectric is a thermally grown oxide, such as silicon oxide or silicon oxynitride. In an embodiment of the present invention, the gate dielectric is a deposited oxide deposited by a conformal process, such as CVD or ALD. The gate dielectric layer can comprise a high k insulating film selected from the group consisting of tantalum oxide, titanium oxide, hafnium oxide, zirconium oxide, PZT, BST, aluminum oxide, and silicate thereof. The blanket deposition of the gate dielectric layer 242 forms the gate dielectric layer over the substrate 202 as well as on top of the exposed portion of gate electrode 238. Next, the gate electrode material 244 for the p type device is blanket deposited over the gate dielectric layer 238. The gate electrode material 244 may be any well known gate electrode material. In an embodiment of the present invention, the gate electrode material is a metal film which has a work function tailored for a p type device. In an embodiment of the present invention, when the semiconductor substrate 202 is n type silicon, the gate electrode material comprises ruthenium, palladium, platinum, cobalt, nickel, and conductive metal oxides with a work function between about 4.9 eV and 5.2 eV. In an embodiment of the present invention, the gate electrode 244 has a work function between 4.9 to 5.2 eV.

Next, as shown in FIG. 2O, the gate electrode material 244 and gate dielectric layer 242 formed on the top surface of dielectric film 230 are removed from a top surface dielectric film 230 to form the gate electrode 246 for the p type device and expose gate electrode 238 for the n type device. The gate dielectric layer and gate electrode material 244 formed on top of the dielectric layer 230 can be removed by, for example, chemical mechanical polishing or other suitable means. At this point, fabrication of an n type device with a metal gate electrode and a p type device with a metal gate electrode utilizing a replacement gate process has been formed. If desired, dielectric layer 230 may now be removed to expose the p type and n type devices as shown in FIG. 2P. Processing can now be utilized to form, for example, silicide on the source and drain regions and to interconnect the n type transistor and p type transistor together into functional integrated circuits to form a complimentary metal oxide semiconductor (CMOS) integrated circuit.

I claim:

1. A method of forming integrated circuit comprising:
    forming a sacrificial gate electrode over a first channel region of a semiconductor substrate and forming a second sacrificial gate electrode over a second channel region of said semiconductor substrate;
    altering said first sacrificial gate electrode and/or said second sacrificial gate electrode such that said first sacrificial gate electrode can be etched with an etchant without etching said second sacrificial gate electrode;
    forming a dielectric layer over said first sacrificial gate electrode and over said second sacrificial gate electrode;
    planarizing said dielectric layer so as to exposed the top surface of said first sacrificial gate electrode and said second sacrificial gate electrode;
    after altering said first sacrificial gate electrode and/or said second sacrificial gate electrode etching said first sacrificial gate electrode with said etchant without etching said second sacrificial gate electrode to form a first opening and expose said first channel region of said semiconductor substrate;
    depositing a first metal film over said first channel region of said semiconductor substrate and on the top surface of said dielectric film;
    removing said first metal film from the top of said dielectric to form a first metal gate electrode;
    removing said second sacrificial gate electrode material to form a second opening;
    forming a second metal film different than said first metal film over said dielectric layer and into said second opening; and
    removing said second metal film from the top surface of said dielectric layer to form a second metal gate electrode.

2. The semiconductor device of claim 1 wherein said first metal film has a work function between 3.9 eV and 4.2 eV.

3. The method of claim 1 wherein said second metal film has a work function between 4.9 eV to 5.2 eV.

* * * * *